United States Patent [19]

Abbas

[11] Patent Number: 4,927,778
[45] Date of Patent: May 22, 1990

[54] METHOD OF IMPROVING YIELD OF LED ARRAYS

[75] Inventor: Daniel C. Abbas, Webster, N.Y.

[73] Assignee: Eastman Kodak Company, Rochester, N.Y.

[21] Appl. No.: 228,654

[22] Filed: Aug. 5, 1988

[51] Int. Cl.$^5$ ............ H01L 21/20; H01L 21/66; H01L 21/302

[52] U.S. Cl. .............. 437/51; 148/DIG. 99; 156/645; 357/17; 357/45; 437/8; 437/23; 437/226; 437/906

[58] Field of Search ............ 148/DIG. 56, 65, 71, 148/72, 84, 99, 104; 156/645, 662; 357/16, 17, 45; 437/8, 23, 51, 160, 167, 170, 226, 227, 905, 906, 987

[56] References Cited

U.S. PATENT DOCUMENTS

| | | | |
|---|---|---|---|
| 3,185,927 | 1/1961 | L. G. Margulis et al. | 324/158 |
| 3,232,799 | 2/1966 | W. C. Dash | 148/175 |
| 3,341,937 | 9/1967 | F. H. Dill, Jr. | 29/583 |
| 3,618,201 | 11/1971 | T. Makimoto et al. | 29/574 |
| 3,813,761 | 6/1974 | Foster | 437/226 |
| 3,816,906 | 6/1974 | Faldesnberg | 437/226 |
| 4,236,296 | 12/1980 | Woolhouse et al. | 437/226 |
| 4,455,562 | 6/1984 | Dolan et al. | 346/154 |
| 4,455,741 | 6/1984 | Kolodner | 437/8 |
| 4,536,778 | 8/1885 | De Schamphelaere et al. | 346/160 |
| 4,542,397 | 9/1985 | Biegelsen et al. | 357/32 |
| 4,590,667 | 5/1986 | Simon | 437/226 |
| 4,596,995 | 6/1986 | Yamakawa et al. | 346/160 |
| 4,604,161 | 8/1986 | Araghi | 437/226 |
| 4,637,938 | 1/1987 | Lee et al. | 427/53.1 |
| 4,660,275 | 4/1987 | Lo | 156/629 |

FOREIGN PATENT DOCUMENTS

| | | | |
|---|---|---|---|
| 0155548 | 12/1981 | Japan | 437/226 |
| 0162434 | 10/1982 | Japan | 437/226 |
| 0159349 | 9/1983 | Japan | 437/226 |
| 0200437 | 11/1984 | Japan | 437/226 |
| 0216443 | 9/1986 | Japan | 437/226 |
| 0077132 | 4/1988 | Japan | 437/226 |

OTHER PUBLICATIONS

"Characterization of Vapor Grown (001) GaAs$_{1-x}$P$_x$ Layers by Selective Photo-Etching" by L. Blok—Journal of Crystal Growth, 31, (1975) pp. 250-255 by North-Holland Publishing Company.

"Enhanced Degradation and Deep-Level Formation at Dislocations in GaAs$_{0.6}$P$_{0.4}$ LED's" by S. Metz-Applied Physics Letter, vol. 30, No. 6-15 Mar. 1977-p. 296.

Primary Examiner—Brian E. Hearn
Assistant Examiner—William D. Bunch
Attorney, Agent, or Firm—Carl O. Thomas

[57] ABSTRACT

A high yield method for the fabrication of multi-element, gallium-arsenide-phosphide light emitting diode arrays having square light emitting elements 7903 square microns on 88.9 micron center suitable for use in electronic/optical printers, is described. The resulting arrays at a current density of 200 A/cm$^2$ have 0.6% power efficiency and a radiant exitance of 3.8 W cm $-2$ with less than 2% standard deviation in element to element radiant exitance. The integrated, relatively low cost LED arrays, are particularly suitable for use in electronic/optical printing applications.

5 Claims, 3 Drawing Sheets

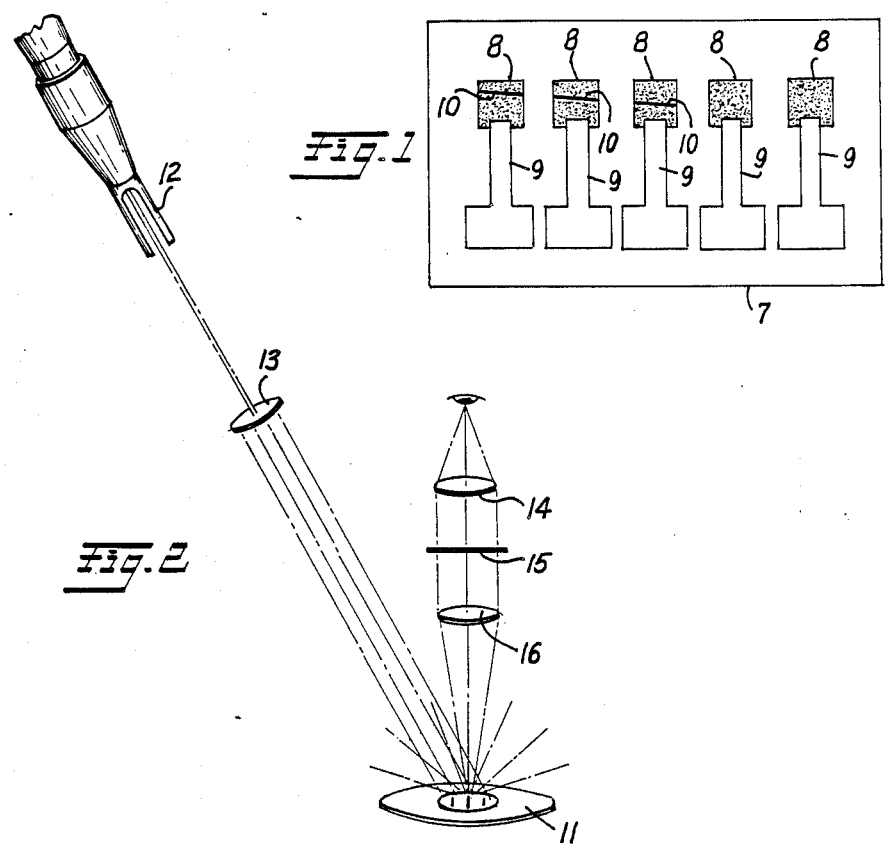
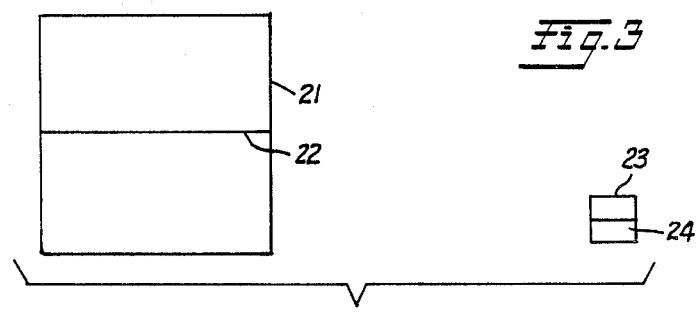

METHOD OF IMPROVING YIELD OF LED ARRAYS

TECHNICAL FIELD

This invention relates to the field of manufacture of semiconductor light emitting diode arrays and in particular to a method of manufacture of light emitting diode (LED) arrays whereby improved yield of usable quality LED arrays is achieved.

More specifically, the invention relates to an improved method of manufacture of integrated LED arrays designed for use in electronic/optical printers whereby increased yield in the production of usable, compact, high density LED arrays for optical printers is achieved.

BACKGROUND PROBLEM

As text and image information generation and transmission becomes increasingly available in digitized, electronic form, the need for producing hard copies of such information directly with low cost, high speed printers increases. An attractive approach for satisfying this need is in the provision of a high-density, compact, linear array of LEDs used in electronic/optical printers. Besides the obvious advantage of compactness and increased density of light sources, the LED array system promises the advantage of being more reliable and less expensive for such use.

Important to printing applications, is the stringent requirement placed on the uniformity of the intensity of light emission from the LED arrays used in the electronic/optical printer. In display applications for LED arrays, uniformity is not nearly as critical as in a printer because the eye is a logarithmic detector and is relatively insensitive to light intensity variations. However, in printing applications, which involve relative movement of a linear array of LEDs across the photosensitive material, an intensity variation of as little as a few tenths of one percent will manifest itself in rasterbanding effects.

There are many aspects of materials used in fabricating solid-state, semiconductor light emitters which affect the performance of LED arrays used in printers, and the way in which the devices are made. Most of these considerations are well documented in textbooks such as "Light-Emitting Diodes" by A. A. Bergh and P. J. Dean published by Clarendon Press, Oxford, 1976 and "Injection Electroluminescent Devices" by C. H. Gooch published by John Wiley & Sons, London, 1973. Because of the completeness of this earlier literature, a detailed discussion of the LED array fabrication process is believed unnecessary. However, one characteristic which is of particular concern during fabrication of LED arrays for use in optical printing applications, has to do with the production of dark-line defects in the completed LED arrays as discussed hereinafter. Dark-line defects in LEDs are caused by the presence of linear crystal irregularities frequently found in light emitting semiconductor wafers supplied by vendors of such materials. To overcome the effects of linear crystal irregularities in the fabrication of LED arrays is a principal purpose of this invention.

SUMMARY OF INVENTION

It is therefore a primary object of the present invention to provide an improved method of manufacturing high quality, compact, high density, comparatively low cost, integrated LED array chips for use in electronic/optical printers whereby improved yield in the production of usable quality LED arrays for this purpose is achieved.

In one aspect, this invention is directed to a method of fabricating integrated light emitting semiconductor diode arrays each comprised of a series of diodes arranged along a major axis comprising:

creating a plurality of diode arrays in a common semiconductor wafer containing parallel linear crystal irregularities that can result in the production of dark line defects in the completed diodes;

subdividing the wafer to produce a plurality of chips each containing at least one of the diode arrays; and selecting diode arrays for use based on the diode to diode uniformity of light emission of the diodes in each array:

characterized by the steps comprising:

examining each semiconductor wafer in advance of formation of the diode arrays to determine the nature and alignment of the parallel linear crystal irregularities; and forming the diode arrays on the semiconductor wafer with their major axes parallel to the parallel linear crystal irregularities.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference characters and wherein:

FIG. 1 is a plan view of a semiconductor chip having a LED array together with electrodes formed thereon and shows the presence of dark-line defects on the surfaces of certain of the LEDs as they would be seen through the eye piece of a laser photoluminescence microscope;

FIG. 2 is a schematic view of a laser photoluminescence microscope system focused on a semiconductor wafer and shows the eye piece of the microscope viewing the surface of a wafer while being illuminated with a photoluminescence producing laser light beam;

FIG. 3 is a plan view of two different light emitting diode surfaces, one of which comprises a square discrete LED 254 microns on the sides of the type that are used for display purposes, and the other right hand, smaller square LED 63.5 microns on each side is of the type usable for printing applications;

BEST MODE OF PRACTICING INVENTION

Figure 4:
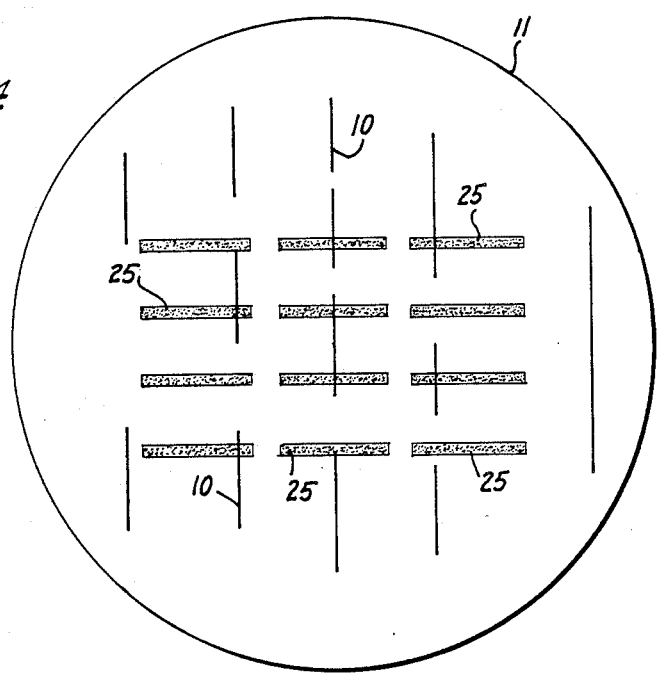
FIG. 4 is a plan view of a plurality of LED arrays which have been masked onto a semiconductor wafer where the elongate axes of the array are positioned at right angles to the axial length of the parallel linear crystal irregularities appearing on the surface of the wafer.

Examination of LED arrays after fabrication with a microscope while they are being operated, most often reveals a number of parallel, linear dark-line defects in some of the LEDS which is referred to as dark-line defects (DLDs). FIG. 1 of the drawings illustrates a semiconductor chip 7 having an array of LEDs formed therein with electrodes 9 attached and wherein it can be seen that the first three of the LED devices in the array possess a dark-line defect (DLD) extending across the width of the device. The DLDs sometimes can extend the length of the entire array. By conducting light measurements, it was determined that those LEDs that have a DLD through them, usually have lower light output than comparable LEDs without the DLDs. Further if more than one array on a given wafer (from which the LED arrays are fabricated) exhibits DLDs, the dark lines of the DLDs are always parallel to each other.

In order to learn more about the DLDs, they were investigated using a laser photoluminescence microscope as illustrated in FIG. 2 of the drawings. With this apparatus, a wafer shown at 11 was irradiated with 515-nm monochromatic light ray produced by an argon-laser 12 and imaged upon the specimen wafer 11 through a beam expander 13. The photoluminescence image produced by the irradiation was then observed through a microscope comprised by the eye piece element 14, filter 15 and microscope objective lens 16. By examining wafers at various stages throughout the fabrication process of LED arrays such as that shown in FIG. 1, it was established that the dark-line defects were present in the starting semiconductor substrate material as received from commercial vendors. The starting wafers were comprised of an n-type gallium arsenide substrate of about 381 microns thickness having a first epitaxially grown layer of n-type $GaAs_{1-x}P_x$ grown thereon and a second epitaxially grown layer $GaAs_{0.7}P_{0.3}$ each of about 20 micron thickness formed over the first epitaxial layer. From these measurements it was determined that the dark-line defects were due to crystalographic defects present in the epitaxial layers on the wafers received from the vendor and were not being introduced during the LED array processing. It was also determined that the density of the dark-line defects varied greatly, not only between different epitaxial lots, but even within a given lot. In a few cases the dark lines were very closely spaced and were even cross hatched, i.e. in addition to the parallel lines commonly observed, an additional set of parallel lines perpendicular to the first set were found. It was further observed that the parallel dark lines were always parallel to sets of cross-hatched surface undulations at least one of which is visible to the naked eye on the surface of wafers. These undulations are known to be caused by slipping of the lattice along crystallographic planes during growth of the epitaxial layers.

Dark-line defects have been known to the industry for some time and have been reported in the literature by L. Blok, Journal of Crystal Growth, 31 250 (1975); S. Metz, Applied Physics Letters,, 30, 296 (1977); and A. A. Bergh and P. J. Dean, "Light-emitting Diodes", Clarendon Press, Oxford, 1976, pp 262-294, and others. Dark-line defects are thought to be due to strain-field induced decoration of slip-plane defects by non-radiative impurities during the growth of the epitaxial layers. At the levels commonly observed, the dark-line defects do not produce too deleterious effects on the operation of discrete light-emitting devices designed for use in displays. In fact, certain vendors who supply the starting wafers, do no qualification of the materials in terms of examination for microscopic defects. They merely fabricate several discrete LEDs from a test wafer and base their quality control on the average light emission intensity of those discrete LEDs. Such a quality-control standard is probably adequate for the vast majority of LED applications of discrete LED devices for displays. For such applications, if a dark-line defect happens to appear in some of the discrete devices, they can be selected out after fabrication if the producer so desires. This is due to the fact that discrete LED devices are often classified and sold with varying specified light emitting efficiencies. For this reason, the dark-line devices probably are not discarded, but instead are sold as less-efficient light emitting devices. In fact, because the effect of the dark lines is usually quite localized compared with the dimensions of the LED devices commonly used for displays, and the efficiency variation toleration for different display applications is quite large, the dark-line defects may largely go unnoticed by most of the industry.

The individual LEDs used in arrays designed for optical printers are much smaller than those used for discrete LED devices and LED arrays employed in displays. This is depicted in FIG. 3 wherein a discrete LED device 21 is shown on the left in which a dark-line defect is shown at 22. An LED device 23 is shown on the right which is designed for use in an optical printer array and it too possesses a dark-line defect 24. In the case of the discrete LED 21, it has a square light emitting face of about 0.0645 square millimeters. In contrast, the optical printer LED 23 has a square light emitting surface of 4032 square micrometers. Because of the larger percentage of LED light emitting area affected by the dark-line defect in the much smaller optical printer LED device 23, the dark-line defects have a much greater impact on the intensity and efficiency of the light produced by the smaller optical LED devices 23 than on the discrete devices 21.

In addition to the above, the uniformity requirements for LED arrays designed for printing applications are far more stringent than they are for display applications due to the human eye's capability for integrating intensity variations, because the human eye is a logarithmic detector and is insensitive to small light intensity variations. Photosensitive recording media, however, are often very sensitive to small intensity variations, so that any variation across the light emitting surface of an individual LED within an array or between LEDs within the array, may appear in the reproduced hard copy of the printer. Further, dark-line defects are also known to be deleterious to the operating lifetime of $Al_{1-x}Ga_xAs$ solid-state light emitting semiconductor devices as reported in the above-noted textbook entitled "Light-emitting Diodes" by Bergh and Dean.

For all of the above reasons, LED arrays with dark-line defects should be rejected for use in printing applications.

Figure 5:
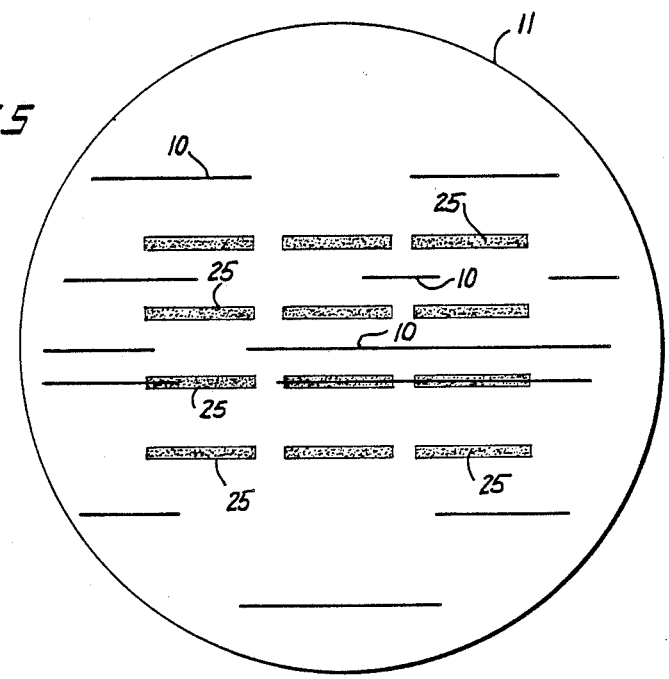
FIG. 5 is a plan view of a wafer having the LED arrays formed thereon with the elongate axes of the arrays extending parallel to the parallel linear crystal irregularities on the wafer.

In order to reduce the impact of dark-line defects on the smaller sized LED arrays made for use in electronic/optical printers, a laser photoluminescence microscope such as shown in FIG. 2 is employed at specific points in the LED fabrication process in order to minimize the effect of dark-line defects in the finished product. FIGS. 4 and 5 of the drawings illustrate the technique. In FIG. 4 a specimen wafer 11 is illustrated as it would appear in the eye piece of the laser electroluminescence microscope. The wafer 11 of FIG. 4 has a plurality of dark-line defects shown generally at 10 which are parallel to and spaced apart from each other. If one should fabricate a plurality of LED arrays indicated at 25 on the surface of the wafer 11 with the elongate axes orientation shown in FIG. 4, it is seen that substantially all of the LED arrays 25 will intersect and be adversely affected by dark-line defects produced as a result of the parallel linear crystal irregularities in the starting wafer 11.

FIG. 5 of the drawings depicts a wafer specimen similar to that of FIG. 4; however, in contrast to FIG. 4, the LED arrays 25 of FIG. 5 have been formed in accordance with the invention by proper orientation and patterning of the zinc diffusion mask used in defining the LED arrays 25 on the surface of the wafer 11, so that the elongate axes of the LED arrays 25 are parallel to any dark-line defects 10. By this procedure the statistical probability of preventing dark line defects with finished LED arrays is greatly improved thereby improving the yield of good LED arrays.

In addition to the procedure shown in FIG. 5, before processing of a commercially supplied wafer as received from a vendor, the laser photoluminescence microscope is used initially to inspect and screen the wafers for parallel linear crystal irregularities which lead to dark-line defects in the finished LEDs. If a wafer has too great a density and extent of linear crystal irregularities, it is rejected prior to processing. However, if the numbers of linear crystal irregularities and their extent is not too great, the laser photoluminescence microscope is used to determine the orientation of the linear crystal irregularities on the surface of the wafer as depicted in FIGS. 4 and 5. The LED arrays are then fabricated pursuant to a process such as that shown in FIG. 6 of the drawings, or by other known suitable processes as described in the above-referenced Bergh and Dean "Light-emitting Diodes" textbook. During such processing, the LED arrays are fabricated with their elongated axes parallel to the parallel linear crystal irregularities as depicted in FIG. 5. This is achieved by visually observing the more prominent linear crystal irregularity that is visually observable to the naked eye as mentioned earlier in the specification. In this manner, occasional entire arrays 25 are ruined by the dark-line defects. However, most of the arrays 25 fall between the dark lines. In contrast, if the arrays 25 were fabricated with their axes perpendicular to the dark-line defects 10 nearly all of the arrays would have a few LEDs with dark-line defects and would be ruined for use with electronic/optical printers for the reasons explained above.

Figure 6:
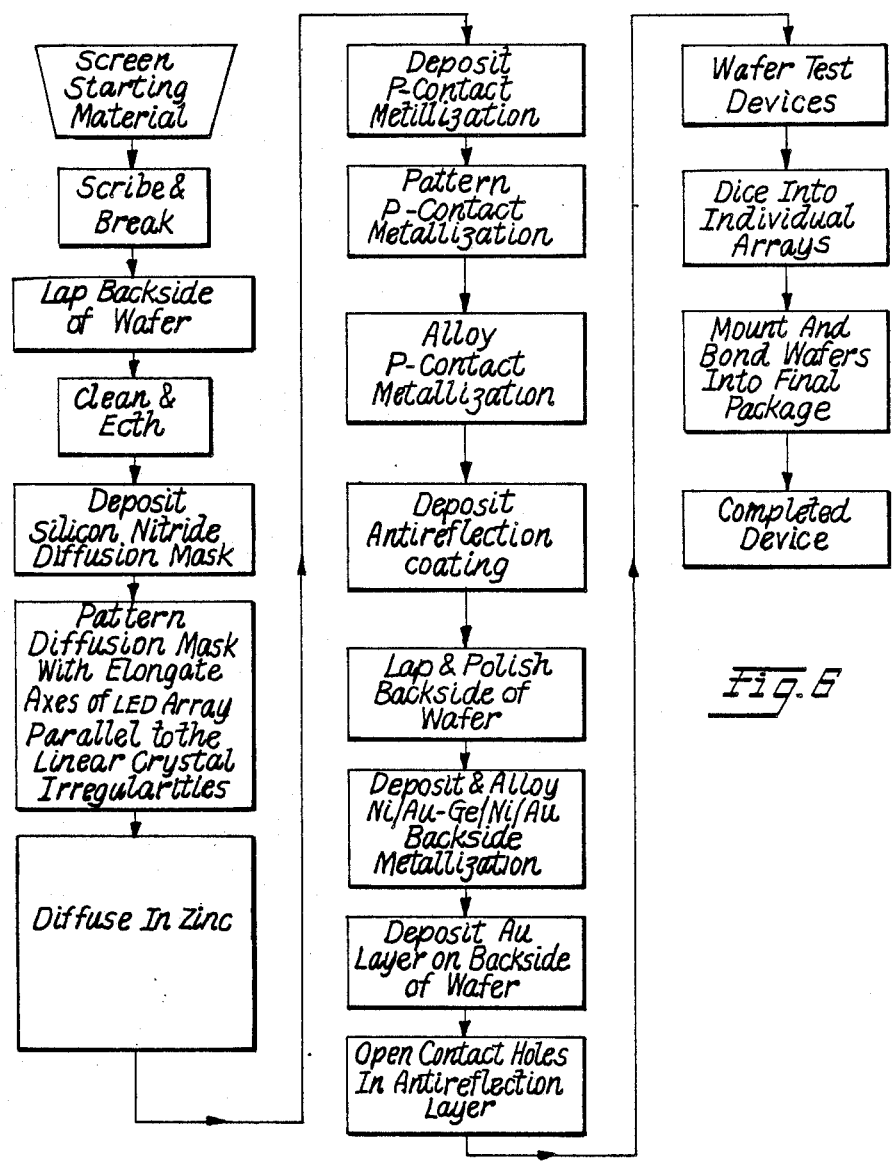
FIG. 6 is a functional flow chart illustrating the fabrication process for LED arrays constructed according to the invention.

The process flow chart shown in FIG. 6 provides a simplified step by step description of a suitable LED array fabrication procedure employed to provide usable LED arrays for electronic/optical printer applications pursuant to the invention. To start the procedure, incoming wafers are screened by examining the wafers for parallel linear crystal irregularities and rejecting those wafers in which the density and extent of the crystal irregularities is too great. On those remaining wafers, the orientation of the DLDs that will be present in the finished LEDs is noted by observing the visible crystal irregularity surface undulations mentioned above. The selected wafers are then scribed and broken into 2.54 centimeter by 2.54 centimeter square chips and lapped to about 457 microns in thickness. The chips are then cleaned and etched to get them ready for deposition of a plasma silicon nitride masking layer. Upon completion of the masking layer deposition step, patterned openings in the diffusion masking layer are then photolithographically defined using a photo-resistive mask with the elongated axis of the LED arrays parallel to the parallel, visually observable, linear crystal irregularities in the surface of the chips as explained with relation to FIG. 5. Zinc then is diffused into the chips through the patterned openings using one of several diffusion processes. Following the zinc diffusion step, the wafers are ready for deposition and patterning of the p contact metallization. A metal lift-off patterning process with aluminum metallization is used for these steps. After patterning, the aluminum is alloyed and a silicon nitride anti-reflection coating is deposited over the wafers. The wafers are then mounted on sodium borosilicate glass discs and lapped and polished down to the final thickness of about 330 microns. Before the chips are dismounted from the discs, they are chemically etched to remove any lapping damage. A backside metallization layer of Ni/Au-Ge/Ni then is vacuum deposited and alloyed. A layer of vacuum deposited gold completes the backside metallization of the LED arrays. The final chip processing step is to open holes in the anti-reflection coating to expose the bonding pads. At this point the LED chips are ready for electrical testing. To finish the devices, the larger size square chips are cut into desired size LED arrays with a dicing saw, then mounted on suitable headers. Finally, ultrasonic wire bonding is used to connect the individual LEDs to the lead out pattern on the header.

Figure 7:
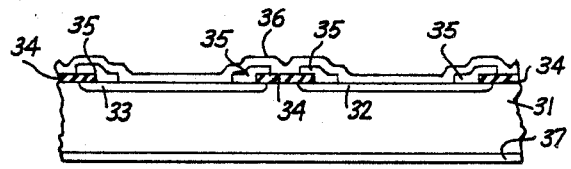
FIG. 7 is a cross sectional view of a typical LED device used in producing the LED arrays fabricated according to the process illustrated in FIG. 6.

FIG. 7 is a cross sectional view of a portion of a completed LED array fabricated pursuant to the invention as described briefly above, and suitable for use in electronic/optical printing applications.

In FIG. 7, a starting substrate 31 of n-GaAsP/GaAs as described earlier has p-regions 32 and 33 formed therein by zinc diffusion through openings in a silicon nitride under coating 34 which serves both as a mask and to electrically isolate each of the LEDs in the array. Aluminum contacts 35 provide electrical connection to the p-layers 32 and 33. An antireflection coating 36 of silicon nitride is deposited over the top surface of the array to improve efficiency of the light emission from the diodes in the array and is provided with suitable openings (not shown) to allow electrical connection to the contacts 35. A backside metallization coating 37 of Ni/Au-Ge/Ni/Au provides electrical connection onto the n-substrate 31.

INDUSTRIAL APPLICABILITY

A method is described for the fabrication of multi-element, gallium-arsenide-phosphide, integrated light emitting diode arrays having square light emitting elements each substantially 7903 square microns on 88.9 micron centers and suitable for use in electronic/optical printers. The resulting arrays at a current density of 200 A/cm$^2$ have 0.6% power efficiency and a radiant exitance of 3.8 W cm $-2$ with less than 2% standard deviation in element to element radiant exitance. The relatively low cost, integrated LED arrays are particularly suitable for use in electronic/optical printing applications and can be produced with high production yields.

Having described one embodiment of a method for improving the production yield of small size, integrated LED arrays in accordance with the invention, it is believed obvious that other modifications and variations of the invention will be suggested to those skilled in the art in the light of the above teachings. It is therefore to be understood that changes may be made in the particular embodiment of the invention described which are within the full intended scope of the invention as defined by the appended claims.

What is claimed is:

1. A method of fabricating integrated light emitting semiconductor diode arrays each comprised of a series of diodes arranged along a major axis comprising:

creating a plurality of diode arrays in a common semiconductor wafer containing parallel linear crystal irregularities that can result in the production of dark line defects in the completed diodes;

subdividing the wafer to produce a plurality of chips each containing at least one of the diode arrays; and selecting diode arrays for use based on the diode to diode uniformity of light emission of the diodes in each array;

characterized by the steps comprising:

examining each semiconductor wafer in advance of formation of the diode arrays thereon to determine the nature and alignment of the parallel linear crystal irregularities; and forming the diode arrays on the semiconductor wafer with their major axes parallel to the parallel linear crystal irregularities.

2. The method according to claim 1 wherein after initial examination of each semiconductor wafer and prior to proceeding further, the method further includes discarding those specimen wafers on which the density, character, extent and spacing of parallel linear crystal irregularities revealed by the laser photoluminescent examination render the wafer unfit for further processing.

3. The method according to claim 2 wherein during the further processing required to form the completed arrays of light emitting diodes, masks employed in fabricating the LED linear arrays are physically aligned with the elongated axes of the diode arrays extending parallel to the parallel linear crystal irregularities at least one of which can be visually observed on the surface of the starting semiconductor wafer.

4. The method according to claim 3 wherein after alignment and formation of the masks used in defining the linear LED arrays, zinc is diffused into one surface of the wafers to form p-regions for the diode arrays using one of several known diffusion processes, deposition followed by patterning of a p-region metallization layer, alloying of the p-region metallization layer, formation of an anti-reflection coating over the surface of the wafers having the metallized p-regions formed thereon, lapping and polishing down the backside of the wafers to a desired thickness, deposition and alloying of a backside metallization layer, opening contact holes in the anti-reflection coating to expose bonding pads to the p-region metallization layer, electrical testing of the LED arrays as thus far complete, dicing the wafers into individual LED linear arrays, and mounting and bonding the arrays on suitable headers to complete the LED array devices.

5. The method according to claim 4 wherein the starting light emitting semiconductor wafers comprise gallium-arsenide-phosphide substrates that exhibit n-type characteristics, the masking layer comprises plasma deposited silicon nitride, the zinc diffusion to form the p-regions is achieved by either a spin-on diffusion source, ion implantation, a closed tube diffusion process or by chemical vapor deposition of zinc oxide films, the p-region metallization is achieved either by vacuum deposition of aluminum contacts or sputter deposit of cadmium-tin oxide contacts, the anti-reflection coating comprises plasma deposited silicon nitride, the backside metallization layer comprises a vacuum deposited multiple layer nickel-gold/germanium nickel alloy, and the contact holes are opened in the anti-reflection coating using a positive photoresist mask and plasma etching to expose the bonding pads.

* * * * *